(12) United States Patent
Tanaka et al.

(10) Patent No.: US 8,035,212 B2
(45) Date of Patent: Oct. 11, 2011

(54) SEMICONDUCTOR CHIP MOUNTING BODY, METHOD OF MANUFACTURING SEMICONDUCTOR CHIP MOUNTING BODY AND ELECTRONIC DEVICE

(75) Inventors: Akira Tanaka, Hamura (JP); Minoru Takizawa, Sagamihara (JP); Mitsuyoshi Tanimoto, Sagamihara (JP); Akihiko Happoya, Kamakura (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 12/621,387

(22) Filed: Nov. 18, 2009

(65) Prior Publication Data
US 2010/0244224 A1    Sep. 30, 2010

(30) Foreign Application Priority Data

Mar. 25, 2009   (JP) .................................. 2009-073903

(51) Int. Cl.
*H01L 23/48* (2006.01)
(52) U.S. Cl. ................... 257/690; 257/783; 257/E23.01; 257/E23.116
(58) Field of Classification Search .................. 257/690, 257/783; 438/118, 124
See application file for complete search history.

(56) References Cited

U.S. PATENT DOCUMENTS

2007/0068622 A1* 3/2007 Konishi ...................... 156/275.7
2009/0179537 A1* 7/2009 Morino et al. ............. 312/223.2

FOREIGN PATENT DOCUMENTS

| JP | 62-22383 A | 1/1987 |
|----|------------|--------|
| JP | 06-061302 A | 3/1994 |
| JP | 08-088248 A | 4/1996 |
| JP | 2000-077476 A | 3/2000 |
| JP | 2000-294601 | 10/2000 |
| JP | 2002-57191 | * 2/2002 |
| JP | 2004-185857 | 7/2004 |
| JP | 2004-288946 A | 10/2004 |
| JP | 2005-303335 A | 10/2005 |
| JP | 2008-060403 A | 3/2008 |
| JP | 2008-060525 A | 3/2008 |

OTHER PUBLICATIONS

Notice of Reason for Rejection mailed by Japan Patent Office on Feb. 16, 2010 in the corresponding Japanese patent application No. 2009-098267.
Final Notice of Reason for Rejection mailed by Japan Patent Office on May 25, 2010 in the corresponding Japanese patent application No. 2009-098267.
Explanation of Non-English Language References.

* cited by examiner

*Primary Examiner* — Ahmed Sefer
(74) *Attorney, Agent, or Firm* — Knobbe Martens Olson & Bear, LLP

(57) ABSTRACT

According to one embodiment, a semiconductor chip mounting body, with an enhanced shock-resistance at portions of the bonding member corresponding to the corners of a semiconductor chip, is provided. The semiconductor chip mounting body includes a circuit board having a circuit pattern formed on a mounting surface thereof, a semiconductor chip mounted on the circuit pattern of the circuit board, and a bonding member arranged at least between the circuit board and the semiconductor chip, and on the sides of the semiconductor chip to fix the semiconductor chip on the circuit board. The bonding member contains thermosetting resin and magnetic powder dispersed in the thermosetting resin. The magnetic powder is locally disposed in portions of the bonding member which is located the corners of the semiconductor chip.

5 Claims, 5 Drawing Sheets

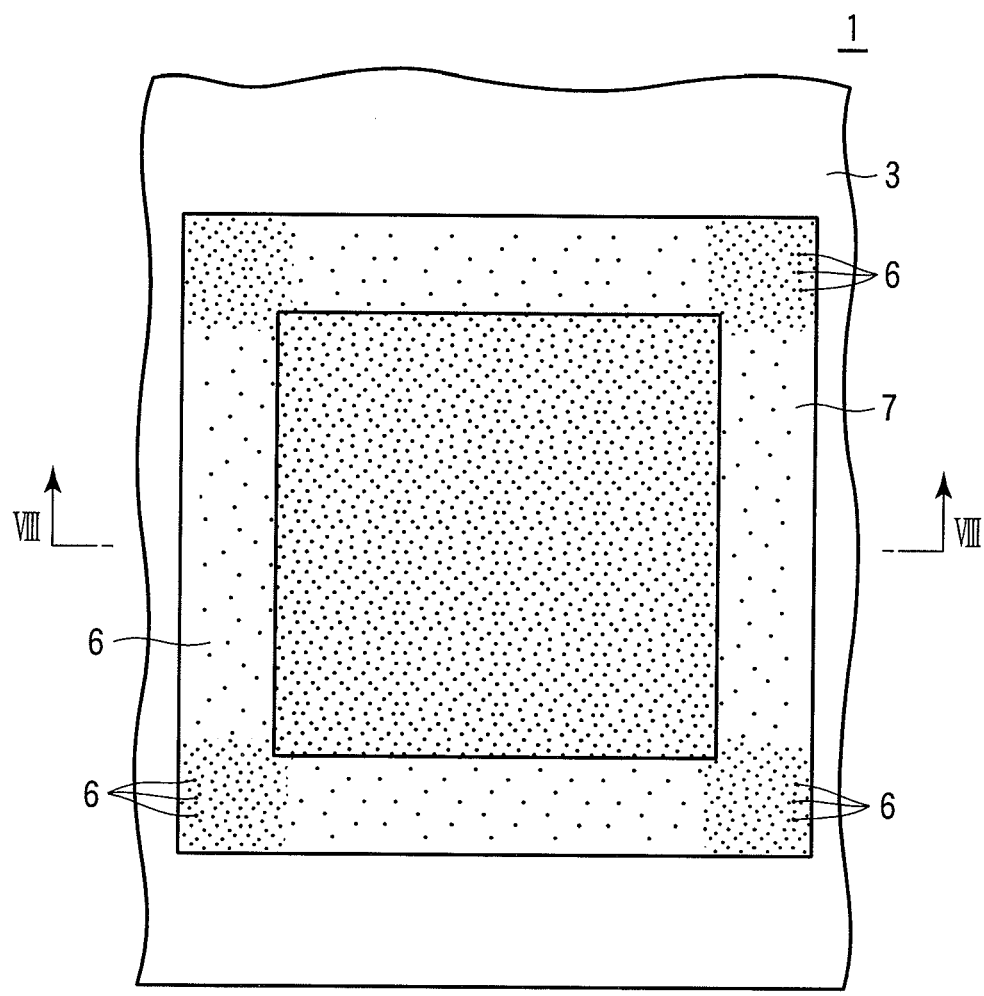
F I G. 7
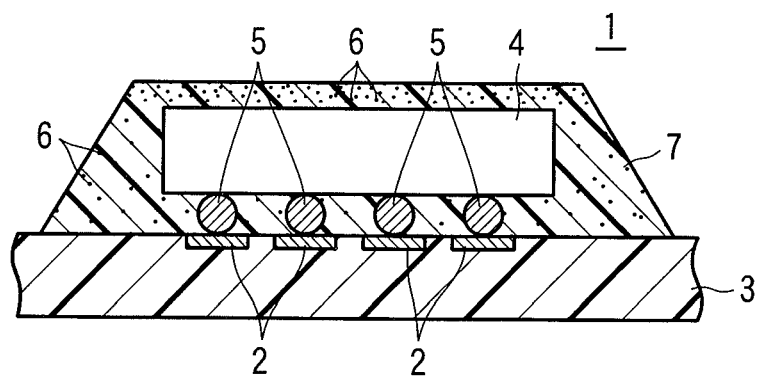
F I G. 8

SEMICONDUCTOR CHIP MOUNTING BODY, METHOD OF MANUFACTURING SEMICONDUCTOR CHIP MOUNTING BODY AND ELECTRONIC DEVICE

CROSS-REFERENCE TO RELATED APPLICATIONS

This application is based upon and claims the benefit of priority from Japanese Patent Application No. 2009-073903, filed Mar. 25, 2009, the entire contents of which are incorporated herein by reference.

BACKGROUND

1. Field

One embodiment of the invention relates to a semiconductor chip mounting body, a method of manufacturing the semiconductor chip mounting body and an electronic device.

2. Description of the Related Art

Recently, semiconductor chip mounting bodies, which are mounted through face-down methods such as ball grid array (BGA) or chip scale package (CSP), are known. The face-down method is carried out by connecting electrodes of semiconductor chips to circuit patterns of circuit boards via solder bumps. The advantage of the mounting technique by face-down method is that the mounting area occupied can be made small. However, in the mounting technique by face-down method, there is a risk that the bonding part (solder) will be destroyed due to the stress brought about by the difference between the thermal expansion coefficients of the circuit board (e.g. glass epoxy resin) and of the chip (silicon).

Based on the above condition, a technique for filling a thermosetting resin solution between the circuit board and the semiconductor chip after the face-down mounting process of connecting electrodes of the semiconductor chip to the circuit pattern of the circuit board via solder bumps, and for forming a hard bonding member is attempted. By fixing the semiconductor chip on the circuit board, the reliability of the connection between the circuit board and the semiconductor chip, with regards to thermal stress caused by processes like heat cycle, is enhanced.

On the other hand, Jpn. Pat. Appln. KOKAI Publication 2000-294601 discloses a mounting body of a semiconductor device wherein a sealing material is filled between the circuit board and the semiconductor chip. This sealing material contains thermosetting resin and filler (e.g. silica filler), whose dielectric constant is smaller than that of the thermosetting resin. The silica filler is disposed in a portion of the sealing material that lies on the circuit board side. The mounting body can be used to reduce crosstalk between interconnections. Further, in Jpn. Pat. Appln. KOKAI Publication 2000-294601, it is disclosed that a filler previously containing a magnetic material is included in a resin composition, for example, metal powder coated with Teflon (registered trademark). In the above document, it is disclosed that the above composition is supplied between the circuit board and the semiconductor device and the filler in the resin composition structure is set on an interface with respect to the circuit board or on an interface with respect to the semiconductor device by utilizing the pulling the filler through the use of a magnet.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 7 is a plane view showing the main portion of a semiconductor chip mounting body according to another modification of the first embodiment.

FIG. 8 is a cross-sectional view taken along line VIII-VIII of FIG. 7.

DETAILED DESCRIPTION

Various embodiments of the invention will be described hereinafter.

According to the first embodiment of the invention, a semiconductor chip mounting body is provided. This mounting body comprises: a circuit board having a circuit pattern formed on a mounting surface thereof; a semiconductor chip mounted on the circuit pattern of the circuit board; and a bonding member supplied at least between the circuit board and the semiconductor chip, and on the sides of the semiconductor chip to fix the semiconductor chip on the circuit board. This bonding member contains thermosetting resin and magnetic powder which is dispersed in the thermosetting resin. This magnetic powder is locally disposed in portions of the bonding member which is located the corners of the semiconductor chip.

According to the second embodiment of the invention, a method of manufacturing a semiconductor chip mounting body is provided. This method is comprised of: mounting a semiconductor chip on a circuit pattern formed on a mounting surface of a circuit board; filling a bonding composite, which contains thermosetting resin and magnetic powder, at least between the circuit board and the semiconductor chip and on the sides of the semiconductor chip in order to form a filler of magnetic powder-containing thermosetting resin; heating the filler; and applying magnetic force to portions of the filler that correspond to the corners of the semiconductor chip. This is done while the filler is thermally cured in order to concentrate the magnetic powder to portions of the filler which is located the four corners of the semiconductor chip, thereby forming a bonding member which is arranged at least between the circuit board and the semiconductor chip and on the sides of the semiconductor chip and in which the magnetic powder is concentrated in portions of the bonding member that correspond to the corners of the semiconductor chip.

According to the third embodiment of the invention, an electronic device is provided. This electronic device is comprised of: a casing; and a semiconductor chip mounting body placed in the casing. The semiconductor chip mounting body comprises a circuit board having a circuit pattern formed on a mounting surface thereof, a semiconductor chip mounted on the circuit pattern of the circuit board, and a bonding member arranged at least between the circuit board and the semiconductor chip and on the sides of the semiconductor chip to fix the semiconductor chip on the circuit board. The bonding member contains thermosetting resin and magnetic powder dispersed in the thermosetting resin. The magnetic powder is locally disposed in portions of the bonding member which is located the corners of the semiconductor chip.

First Embodiment

Figure 1:
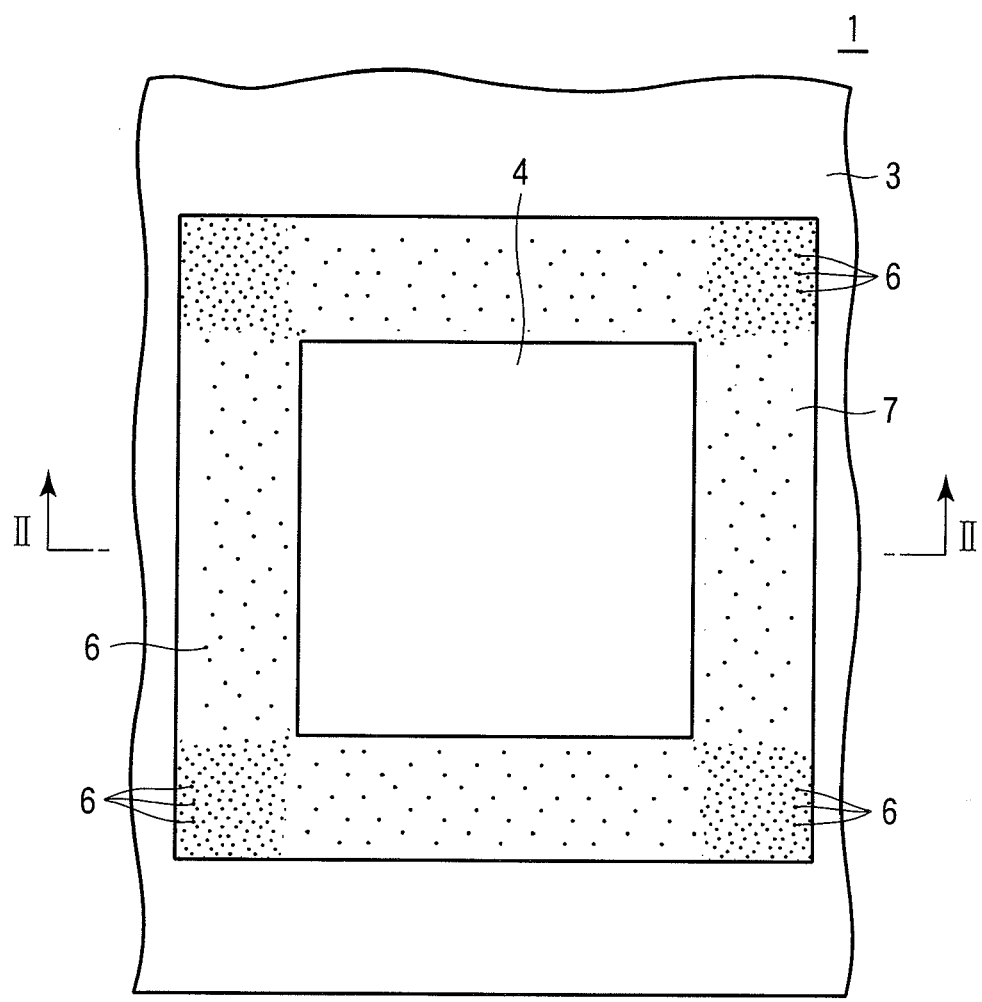
FIG. 1 is a plane view showing the main portion of a semiconductor chip mounting body according to the first embodiment of this invention.
Figure 2:
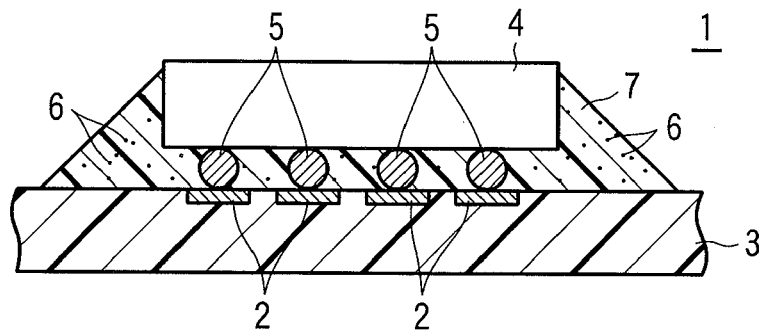
FIG. 2 is a cross-sectional view taken along line II-II of FIG. 1.

FIG. 1 is a plane view showing a semiconductor chip mounting body according to the first embodiment and FIG. 2 is a cross-sectional view taken along line II-II of FIG. 1.

A semiconductor chip mounting body 1 includes a circuit board 3 having a circuit pattern, for example, Cu pads 2 formed on the mounting surface thereof. A semiconductor device, for example, a rectangular silicon bare chip 4 which is BGA-mounted by connecting its electrodes (not shown) to the Cu pads 2 of the circuit board 3 using solder balls 5. A bonding member 7, which contains thermosetting resin and magnetic powder 6, is placed between the circuit board 3 and the silicon bare chip 4, and on the four sides of the silicon bare chip 4 to fix the silicon bare chip 4 on the circuit board 3. As shown in FIG. 1, the magnetic powder 6 is locally disposed in portions of bonding member 7 corresponding to the four corners of the silicon bare chip 4.

For example, epoxy resin can be used as the thermosetting resin, which makes up a bonding member. For a concrete epoxy resin, thermosetting-liquid epoxy resin can be used.

Examples of the magnetic powder, which is distributed in the thermosetting resin of the bonding member, include ferrite ($Fe_2O_3$) powder, neodymium type magnetic powder, cobalt type magnetic powder, alkonia type magnetic powder, ferrite type magnetic powder, silicon steel powder, iron powder, permalloy powder, and magnetic stainless steel powder. Among the above-mentioned magnetic powders, insulating ferrite is specially preferred.

It is preferable that the magnetic powder has a spherical shape so that it will be able to move easily with regards to the magnetic action which will be described later. It is also preferable that the magnetic powder has a mean particle size of 0.1 to 10 μm.

It is preferred that the magnetic powder fills 30 to 90% by weight of the bonding member.

The expression "the magnetic powder 6 is locally disposed in bonding member 7 corresponding to the four corners of the silicon bare chip 4" means that the magnetic powder 6 having the above-mentioned mean grain size is provided in portions of bonding member 7 that correspond to the corners of the silicon bare chip 4 with density of 60 to 95% by weight. With regards to this kind of bonding member 7, the magnetic powder 6 in areas other than the corners of the silicon bare chip 4 has a density of 20 to 40% by weight.

The manufacturing method of the semiconductor chip mounting body according to the first embodiment is explained below.

Figure 3:
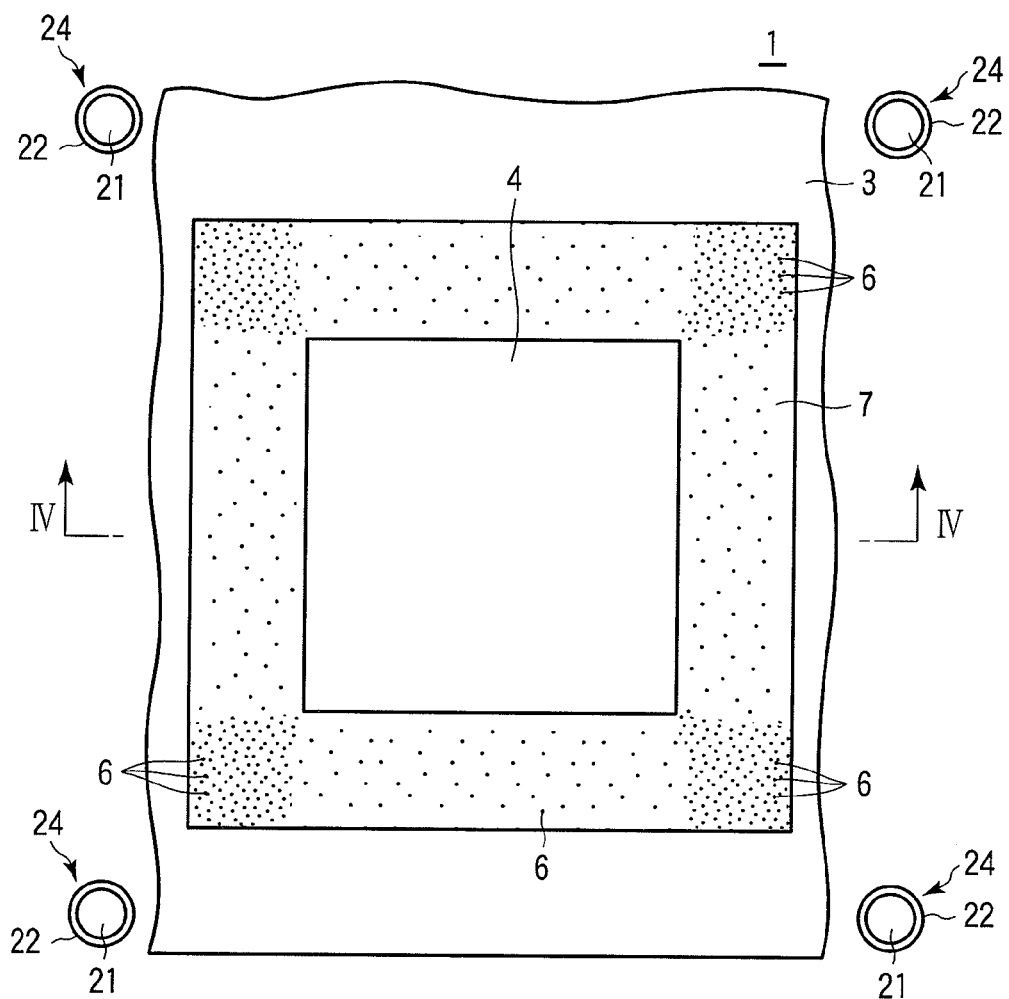
FIG. 3 is a plane view illustrating the method of manufacturing a semiconductor chip mounting body according to the first embodiment.
Figure 4:
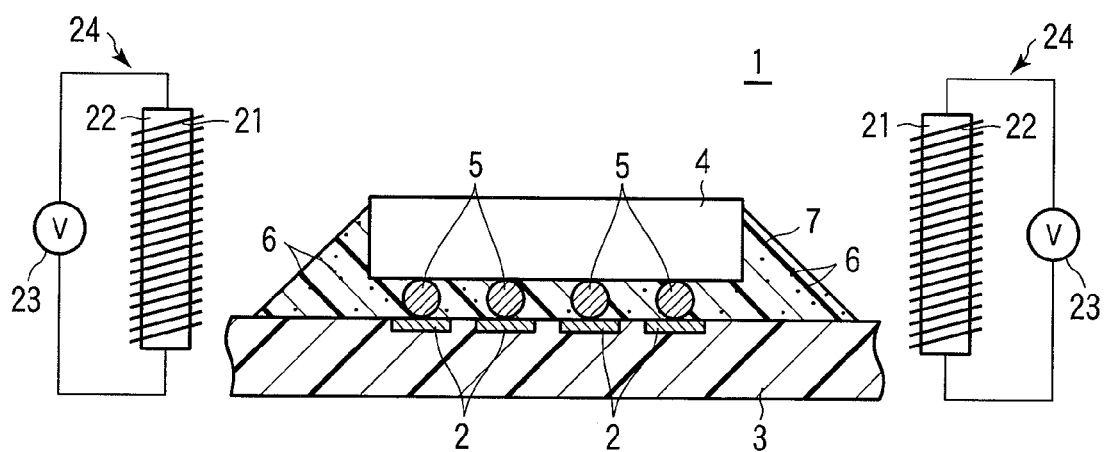
FIG. 4 is a cross-sectional view taken along line III-III of FIG. 3.

First, the BGA-mounting process of connecting electrodes of the rectangular silicon bare chip 4 to the Cu pads 2 of the circuit board 3 via solder balls 5 is performed. Then, a bonding composite 7 is supplied between the circuit board 3 and the silicon bare chip 4 and on the sides of the silicon bare chip 4. The bonding composite 7 contains thermosetting resin and magnetic powder 6 (for example, a thermosetting-liquid epoxy resin solution containing magnetic powder, 50% by weight). Thus, a filler composed of magnetic powder-containing epoxy resin is formed. This circuit board 3 is placed on a conveyor belt of a reflow furnace. While the circuit board 3 is being fed in the furnace, the filler 7 of the epoxy resin, which contains magnetic powder 6, is heated. As shown in FIG. 3 and FIG. 4, during the thermosetting of the filler 7, electromagnets 24 (which comprises of power sources 23 connected to coils 22 that wound around iron cores 21) are arranged in the reflow furnace so that the iron cores 21 extending in a vertical direction may be placed opposite each another at the four corners of the silicon bare chip 4. Voltages controlled by a control unit (not shown) are supplied from power sources 23 to coils 22 to generate magnetic forces while the filler 7 is being cured by heating. At this time, the magnetic powder 6 in the filler 7 is attracted towards the iron cores 21 by magnetic forces and becomes concentrated at portions of the filler 7 corresponding to the four corners of the silicon bare chip 4. As a result, after curing, the magnetic powder 6 in the bonding member 7, supplied between the circuit board 3 and the silicon bare chip 4 and on the four sides of the silicon bare chip 4, is locally disposed at the four corners of the silicon bare chip 4. Thus, a semiconductor chip mounting body is produced.

After the magnetic force is applied, the magnetic powder 6 in the bonding member 7 is magnetized and if the semiconductor chip mounting body 1 is shipped in this state, there is an undesired magnetic influence to the peripheral devices of the semiconductor chip mounting body 1. Therefore, it is desirable to subject the bonding member 7 to a demagnetization process after the magnetic force is applied.

As described above, in the semiconductor chip mounting body 1 according to the first embodiment, bonding member 7 containing the thermosetting resin and magnetic powder 6 is disposed between the circuit board 3 and the silicon bare chip 4, and at the four sides of the silicon bare chip 4 in order to fix the silicon bare chip 4 on the circuit board 3. Since the magnetic powder 6 in the bonding member 7 is locally disposed at the four corners of the silicon bare chip 4, the Young's modulus and the degree of hardness of bonding member 7 at the corners can be increased.

That is, with regards to the bonding member 7 that fixes the silicon chip 4 on the circuit board 3, external shocks become concentrated at the four corners of the rectangular silicon bare chip 4. Therefore, the corresponding portions tend to crack or be destroyed easily. A bonding member with a uniformly dispersed magnetic powder in the thermosetting resin cannot sufficiently cope with external shocks.

The Young's modulus and the degree of hardness at the corners of the bonding member 7 can be increased by locally disposing the magnetic powder 6 in portions of bonding member 7 that correspond to the four corners of the rectangular silicon bare chip 4 as described in the first embodiment. Thus, even if external shocks are applied to the corner portions of bonding member 7, these shocks can be absorbed. That is, shock resistance can be enhanced. As a result, since bonding member 7 can be prevented from being cracked or destroyed at the corners, the reliability of the connection between the circuit board 3 and the silicon bare chip 4 can also be enhanced.

The semiconductor chip mounting body according to the first embodiment is not limited to the structure shown in FIG. 1 and FIG. 2.

Figure 5:
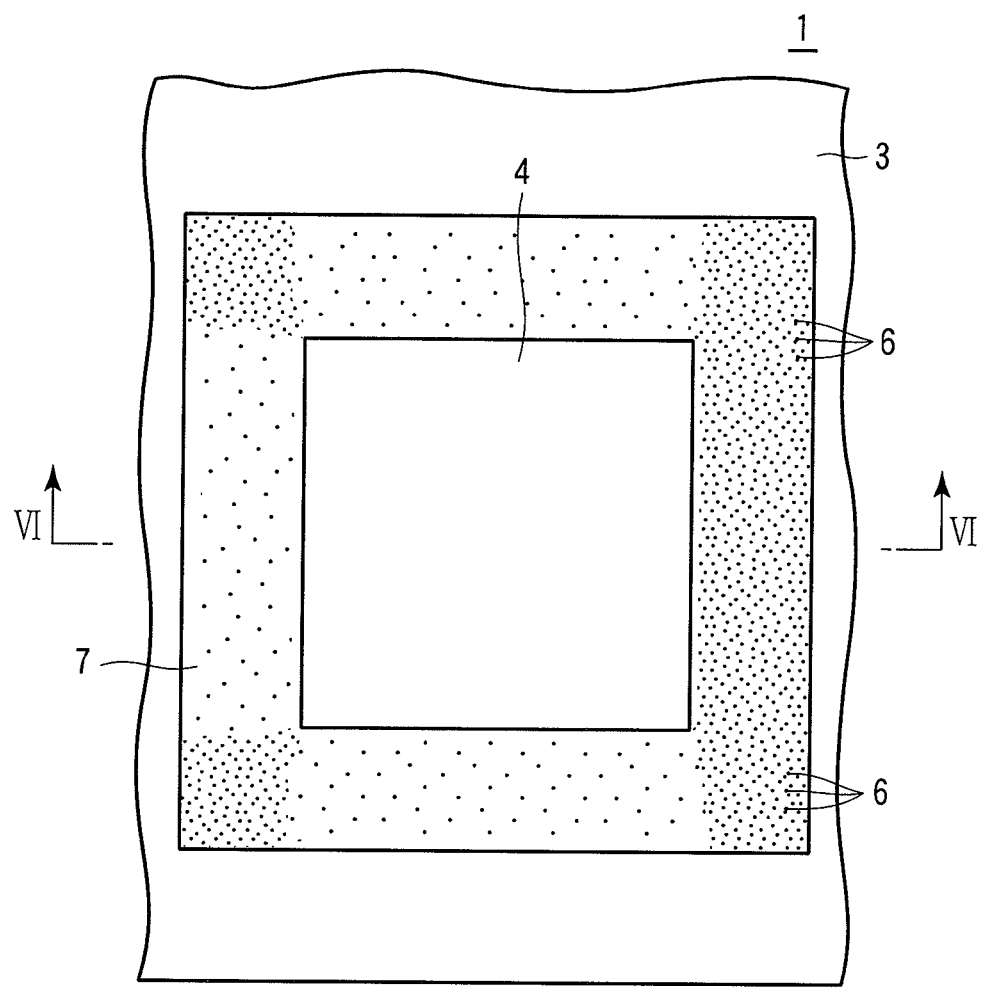
FIG. 5 is a plane view showing the main portion of a semiconductor chip mounting body according to a modification of the first embodiment.
Figure 6:
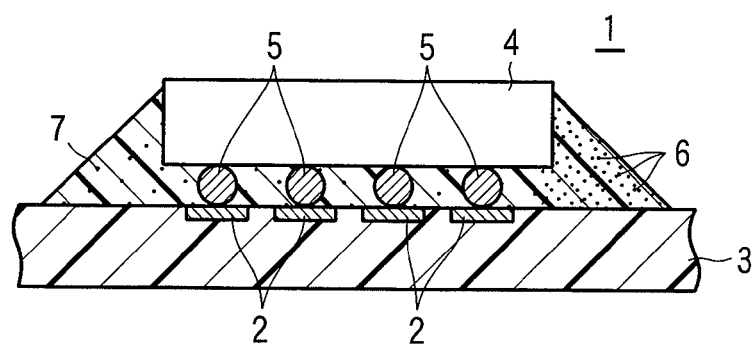
FIG. 6 is a cross-sectional view taken along line IV-IV of FIG. 5.

For example, in the semiconductor chip mounting body 1 shown in FIG. 5 and FIG. 6, magnetic powder 6 is locally disposed not only at the four corners of the rectangular silicon bare chip 4 but also at the right side surface of bonding member 7 is located at the side of the electromagnetic wave source. In other words, at the right side surface of bonding member 7 is located opposite to the electromagnetic wave source. To locally dispose magnetic powder 6 at the right side of bonding member 7, epoxy resin which contains magnetic powder 6 is filled in between circuit board 3 and silicon bare chip 4 and at the four sides of silicon bare chip 4. This resin is heated and during the curing process, the iron cores 21 of the electromagnets 24 are arranged parallel to the filler, which forms the right side of bonding member 7 as shown in FIG. 3 and FIG. 4. From the power source 23 of the electromagnets, voltage is provided to the coils 22 around the iron cores 21 in order to generate magnetic forces.

According to the semiconductor chip mounting body 1 with the structure shown in FIG. 5 and FIG. 6, interference associated with electromagnetic waves from the electromagnetic wave source can be reduced by the presence of magnetic powder 6 locally disposed at the right side of bonding member 7. As a result, the silicon bare chip 4 can be protected from electromagnetic waves.

Further, in a semiconductor chip mounting body 1 shown in FIG. 7 and FIG. 8, a bonding member 7 containing thermosetting resin and magnetic powder 6 is supplied between circuit board 3 and silicon bare chip 4, at the four sides of silicon bare chip 4, and on the upper surface of the silicon bare chip 4. That is, all surfaces of the silicon bare chip 4 except the parts connected to the solder balls 5 are covered with bonding member 7. The magnetic powder 6 is locally disposed not only at portions of bonding member 7 which is located the four corners of the silicon bare chip 4 but also at the surface of bonding member 7 that covers the upper surface of silicon bare chip 4. In order to locally dispose magnetic powder 6 to the surface of bonding member 7 covering silicon bare chip 4, epoxy resin containing magnetic powder is filled between the circuit board 3 and silicon bare chip 4, on the four sides, and on the upper surface of silicon bare chip 4. This filling is heated and during the curing process, the iron core 21 of the electromagnet 24 is arranged parallel to the surface of the filling (bonding member 7) which covers silicon bare chip 4 as shown in FIG. 3 and FIG. 4. Magnetic force is generated by providing voltage from the electric source 23 of the electromagnet 24 to the coil 22 around the iron core 21.

According to the semiconductor chip mounting body 1 with the structure shown in FIG. 7 and FIG. 8, even if electromagnetic waves are applied to the surfaces of the silicon bare chip 4, interference associated with these electromagnetic waves can be reduced by the presence of the magnetic powder 6 locally disposed in the surface portions of bonding member 7 covering silicon bare chip 4. As a result, the silicon bare chip 4 can be protected from electromagnetic waves.

Second Embodiment

Figure 9:
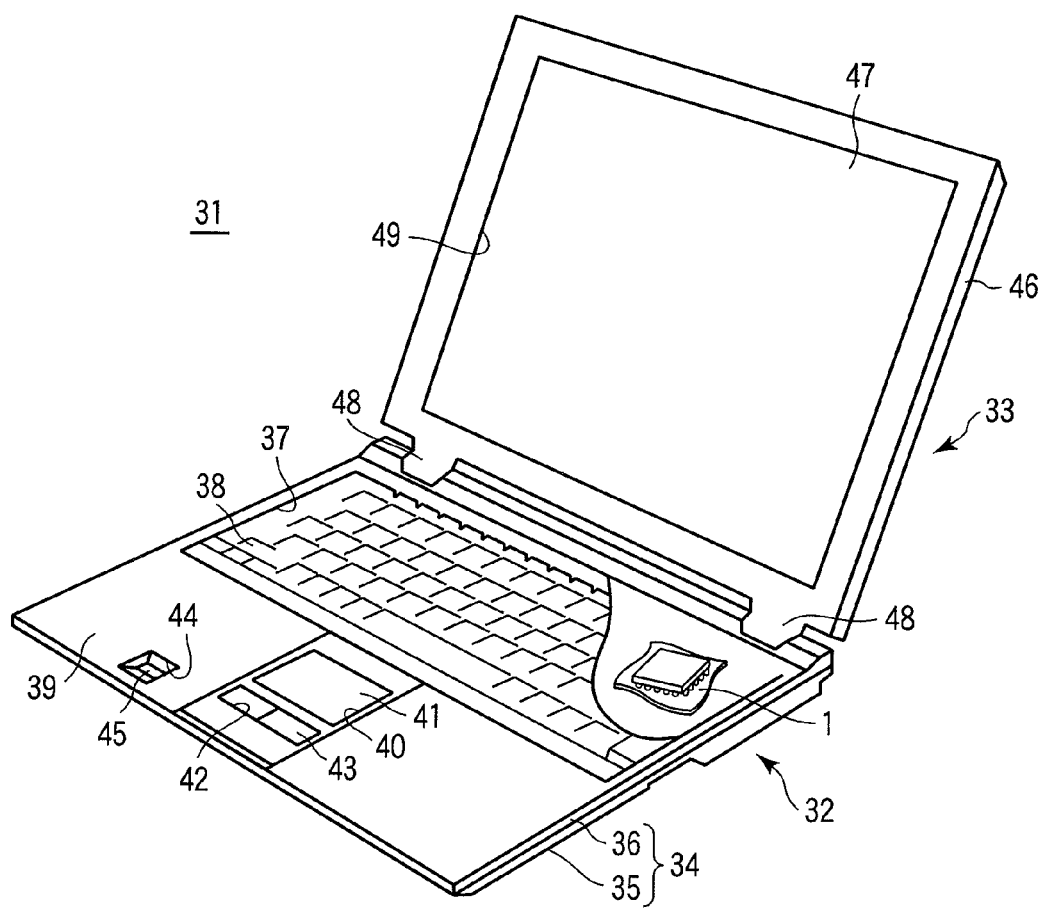
FIG. 9 is a perspective view showing a laptop computer according to the second embodiment of this invention.

FIG. 9 is a perspective view showing an electronic device, for example, a laptop computer according to a second embodiment of this invention.

A portable computer 31 includes a main body 32 and a display unit 33 supported by the main body 32. Main body 32 has casing 34. Casing 34 has a flat box-like form with a rectangular base 35 and a rectangular cover 36.

Cover 36 which is part of casing 34 is made from a resin with light transmission characteristics such as acrylic resin. A rectangular opening 37 is formed from the center to the rear-half portion of casing 36. A keyboard 38 is exposed from opening 37.

The semiconductor chip mounting body 1 shown in FIG. 1 and FIG. 2 is mounted on a portion below keyboard 38 and above base 35. The front-half portion of the cover 36 configures palm rest 39. An opening 40 is formed in the central portion of palm rest 39. A track pad 41 is exposed from opening 40. An opening 42 is formed in the palm rest 39 on the front side of the track pad 41. A determination switch 43 is exposed from opening 42. An opening 44 is formed in the palm rest 39 on the left side of the determination switch 43. A fingerprint reading unit 45 is provided in the opening 44.

The display unit 33 has a display housing 46 and a liquid crystal panel 47 inside. The display housing 46 is supported on the casing 34 of the main body 32 by a pair of hinge portions 48 so as it can be rotated freely. A display window portion 49 is formed in the front wall of the display housing 46. The window portion 49 has an area occupying a large part of the front wall and the display screen of the liquid crystal panel 47 is exposed to the exterior of the display housing 46 via the window portion 49.

Portable computer 31 with the above structure would have a high reliability by installing semiconductor chip mounting body 1 inside casing 34. The reason for this is that the reliability of the connection between the circuit board 3 and the silicon bare chip member 4 was enhanced by locally disposing magnetic powder 6 in portions of bonding member 7 which is located the four corners of the silicon bare chip 4. This bonding member 7, which contains thermosetting resin and magnetic powder 6, is filled between a circuit board 3 and a silicon bare chip 4 and on the four sides of the silicon bare chip 4 to fix silicon bare chip 4 on the circuit board 3.

Further, if the semiconductor chip mounting body 1 shown in FIGS. 5 and 6 or FIGS. 7 and 8 is installed inside casing 34, the silicon bare chip 4 of the semiconductor chip mounting body 1 can be protected from electromagnetic waves. As a result, the portable computer 31 with a higher reliability can be provided.

The electronic device according to the second embodiment is not limited to the notebook portable computer and can be applied to a mobile telephone, PHS, VTR with camera and the like.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the forms of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
    a casing; and
    a semiconductor chip mounting body placed inside the casing; wherein the semiconductor chip mounting body comprises a circuit board having a circuit pattern formed on the mounting surface thereof, a semiconductor chip mounted on the circuit pattern of the circuit board, and a bonding member arranged at least between the circuit board and the semiconductor chip and on the sides of the semiconductor chip in order to fix the semiconductor chip on the circuit board, wherein the bonding member comprises thermosetting resin and magnetic powder dispersed in the thermosetting resin, wherein the grains of magnetic powder are non-uniformly dispersed within the resin, such that the powder has a higher concentration at the bonding portions corresponding to the corners of the semiconductor chip.

2. The electronic device of claim 1, wherein the non-uniformly dispersed grains of magnetic powder are further dispersed within the resin such that the powder has a higher concentration on a side surface of the bonding member opposite to an electromagnetic wave source.

3. The electronic device of claim 1, wherein the bonding member is extended to cover a surface of the semiconductor chip which is located on the opposite side from a surface of the semiconductor chip facing the circuit board and wherein the non-uniformly dispersed grains of magnetic powder are dispersed within the resin such that the powder has a higher concentration in the surface of the bonding member located on the opposite side from the surface facing the circuit board.

4. The electronic device of claim 1, wherein the magnetic powder is ferrite powder.

5. The electronic device of claim 1, wherein the magnetic powder has a mean particle size of 0.1 to 10 μm.

* * * * *